(12) United States Patent
Lee et al.

(10) Patent No.: US 12,113,524 B2
(45) Date of Patent: Oct. 8, 2024

(54) ACTIVE BOOTSTRAPPING DRIVERS

(71) Applicant: Efficient Power Conversion Corporation, El Segundo, CA (US)

(72) Inventors: Edward Lee, Fullerton, CA (US); Michael Chapman, Long Beach, CA (US); Ravi Ananth, Laguna Niguel, CA (US); Michael A de Rooij, Playa Vista, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 7 days.

(21) Appl. No.: 18/062,660

(22) Filed: Dec. 7, 2022

(65) Prior Publication Data

US 2023/0179203 A1 Jun. 8, 2023

Related U.S. Application Data

(60) Provisional application No. 63/287,155, filed on Dec. 8, 2021.

(51) Int. Cl.
*H03K 17/687* (2006.01)
(52) U.S. Cl.
CPC . *H03K 17/6871* (2013.01); *H03K 2217/0063* (2013.01); *H03K 2217/0072* (2013.01)
(58) Field of Classification Search
CPC .................................................. H03K 17/6871
USPC ........................................................ 327/109
See application file for complete search history.

(56) References Cited

U.S. PATENT DOCUMENTS

| | | | |
|---|---|---|---|
| 5,818,209 A | 10/1998 | Masini et al. | |
| 9,667,245 B2 | 5/2017 | de Rooij et al. | |
| 10,784,764 B2 | 9/2020 | Jodka et al. | |
| 10,790,811 B2 | 9/2020 | Lee et al. | |
| 2005/0102128 A1 | 5/2005 | Wilhelm | |
| 2015/0162832 A1 | 6/2015 | Briere | |
| 2017/0230046 A1* | 8/2017 | de Rooij ............ | H03K 17/6871 |
| 2017/0346475 A1 | 11/2017 | de Rooij et al. | |
| 2019/0028094 A1 | 1/2019 | Reusch et al. | |
| 2020/0076415 A1 | 3/2020 | Lee et al. | |
| 2020/0153420 A1 | 5/2020 | Pigott et al. | |

FOREIGN PATENT DOCUMENTS

| | | |
|---|---|---|
| EP | 3 205 021 B1 | 12/2021 |
| TW | I304288 B | 12/2008 |

* cited by examiner

*Primary Examiner* — Tomi Skibinski
(74) *Attorney, Agent, or Firm* — Blank Rome LLP (57) ABSTRACT

A circuit to enhance the driving capability of conventional inverting bootstrapping GaN drivers. When the inverting driver input is logic high and the driver output is off, the voltage stored on the first bootstrap capacitor for turning on the high side (pull-up) FET of the inverting driver is charged to the full supply voltage using an active charging FET, instead of using a diode or diode-connected FET in a conventional bootstrapping driver. The gate voltage of the active charging FET is bootstrapped to a voltage higher than supply voltage by a second bootstrap capacitor that connects to the inverting driver input, which is at a logic high. The second bootstrap capacitor is charged by an additional diode or diode-connected FET connected to the supply voltage when the inverting driver input is a logic low.

8 Claims, 8 Drawing Sheets

ACTIVE BOOTSTRAPPING DRIVERS

This application claims the benefit of U.S. Provisional Application No. 63/287,155 filed Dec. 8, 2021, the disclosure of which is incorporated by reference in its entirety.

BACKGROUND OF THE INVENTION

Typical high side FET gate drivers rely on a bootstrapping circuit to provide an increased voltage to a gate terminal of the high side FET. Bootstrapping gate drivers store energy in capacitors while an associated high side FET is turned off, and use the stored energy to apply a voltage greater than a supply voltage to the gate terminal of the high side FET, keeping it turned on despite increases in voltage on a source terminal of the high side FET.

Figure 1:
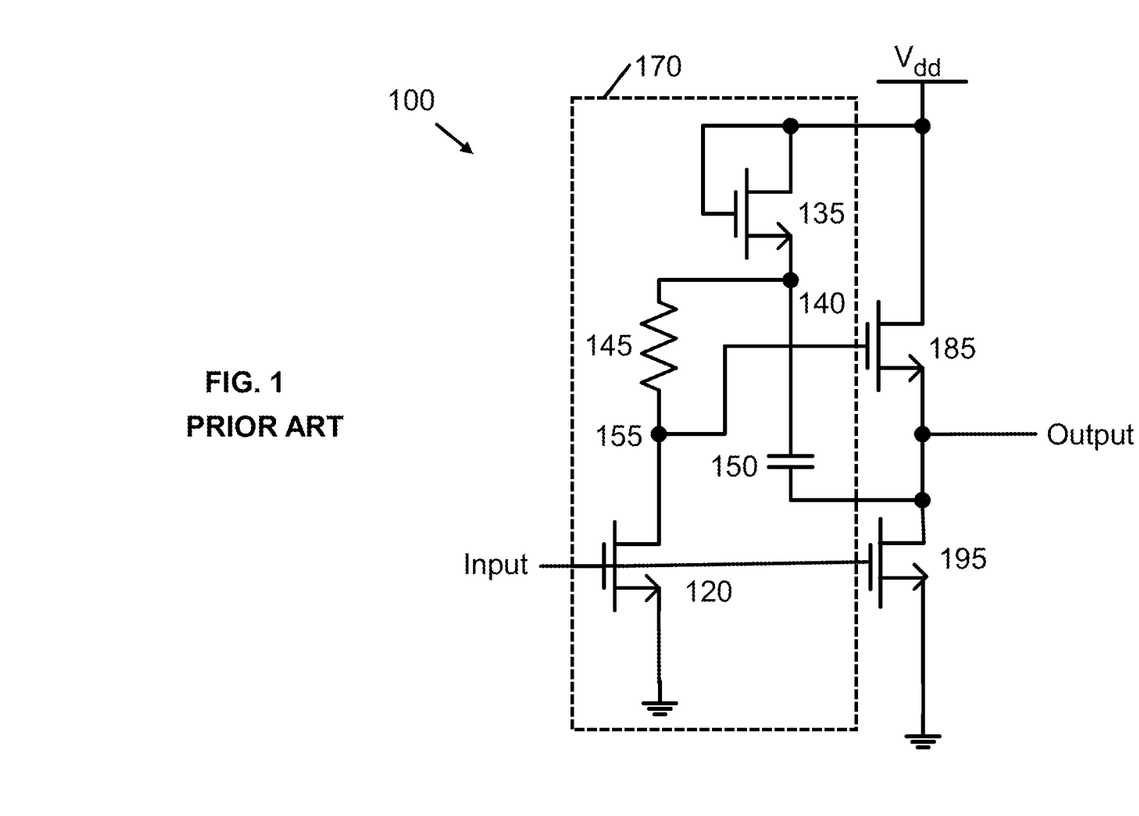
FIG. 1 is a schematic of a conventional bootstrapping gate driver circuit.

FIG. 1 is a schematic of a conventional bootstrapping gate driver for a high side FET transistor. In FIG. 1, system 100 includes a bootstrapping gate driver 170, a high side FET 185, a low side FET 195 and an output. Bootstrapping gate driver 170 is coupled to the gate terminal of high side FET 185. The drain terminal of high side FET 185 is coupled to a supply voltage source $V_{dd}$, and the source terminal of high side FET 185 is coupled to a load (not shown) at the output. Bootstrapping gate driver 170 receives a control signal at the input and drives high side FET 185 based on the input. A logic high input is indicative that high side FET 185 is to be turned off, and a logic low input is indicative that high side FET 185 is to be turned on. FET 185 acts as a closed switch, connecting a load at the output to supply voltage $V_{dd}$, based on the output from bootstrapping gate driver 170 and the input.

Bootstrapping gate driver 170 includes FET transistors 120 and 135, resistor 145, and capacitor 150. The gate terminal of FET 120 receives the input, and the source terminal of FET 120 is coupled to ground. The drain terminal of FET 120 is coupled to resistor 145 at node 155. Resistor 145 is further coupled to the source terminal of FET 135 at node 140. The gate terminal and the drain terminal of FET 135 are shorted together, configuring FET 135 as a diode, and are coupled to supply voltage $V_{dd}$. Alternatively, FET 135 can be replaced with a diode with its anode connected to $V_{dd}$ and its cathode connected to node 140.

Capacitor 150 is coupled between node 140 and the output. The gate terminal of FET 185 is coupled to node 155.

In response to a logic high input, FET 120 acts as a closed switch connecting node 155 to ground, causing high side FET 185 to turn off and act as an open switch and disconnecting the output from supply voltage $V_{dd}$. Capacitor 150 is charged from supply voltage $V_{dd}$ via FET 135 and FET 120.

In response to the input being logic low, FET 120 acts as an open switch, disconnecting node 155 from ground. Diode-configured FET 135 and pullup resistor 145 increase the voltage on node 155 above the threshold voltage $V_{Th}$ of high side FET 185 and turn it on. High side FET 185 then acts as a closed switch and connects the output to the supply voltage $V_{dd}$. As the voltage on the output increases, energy stored in capacitor 150 discharges through node 140, pull up resistor 145, and node 155, which increases the voltage on nodes 140 and 155. As the voltage on the output approaches the supply voltage $V_{dd}$, the voltage on node 155 increases to approximately the voltage on the output plus the voltage across capacitor 150, above the supply voltage $V_{dd}$. The increased voltage above $V_{dd}$ on node 155 and the low on-resistance of power transistor switch 185 keep power transistor switch 185 turned on as the voltage on its source terminal increases to approximately $V_{dd}$.

A turn-off FET transistor 195 is incorporated into the system. The gate terminal of turn-off FET 195 receives the input, and the source terminal of turn-off FET 195 is coupled to ground. The drain terminal of turn-off FET 195 is coupled to the output. In response to input being logic high, turn-off FET 195 acts as a closed switch, connecting the output to ground, and quickly decreasing the voltage at the output from approximately $V_{dd}$ to ground. Bootstrapping gate driver 170 shown advantageously balances static currents during turn-off of high side FET 185 with the length of the turn-on time using resistor 145. A larger resistance for resistor 145 decreases static currents in bootstrapping gate driver 170 and reduces the overall power consumption of bootstrapping gate driver 170, but also slows the turn-on of high side FET 185.

For a logic high input, FETs 120 and 195 are on. Hence, the voltage at node 155 and the voltage at the output are at ground. The bootstrap capacitor 150 is charged to $V_{dd}-V_{GS\_135}$, where $V_{GS\_135}$ is the gate-to-source voltage of transistor 135. If $V_{GS\_135}$ is assumed to be zero, the bootstrap capacitor will be charged to $V_{dd}$.

For a logic low input, FETs 120 and 195 are off. The voltage on the bootstrap capacitor 150 is applied to the $V_{GS}$ of FET 185 ($V_{GS\_185}$) via resistor 145, with the voltage at node 140 equal to the voltage at node 155 and turning on FET 185. The output will increase to $V_{dd}$ when the voltage at node 140 and the voltage at node 155 go above $V_{dd}$ due to the voltage stored on the bootstrap capacitor 150.

For a given bootstrap capacitor 150 having capacitance of $C_{BS}$ and a high side FET 185 having a gate-to-source capacitance of $C_{GS\_185}$, the gate-to-source voltage on high side FET 185 ($V_{GS\_185}$) will be equal to $V_{dd} \cdot C_{BS}/(C_{BS}+C_{GS\_185})$ for a logic low input. A lower $V_{GS\_185}$ when the input is a logic low leads to slower pulling "out" to $V_{dd}$.

The prior art bootstrapping circuit of FIG. 1 has the following disadvantages:
1. When the input is logic high, the threshold voltage ($V_T$) drop on diode-connected FET 135 limits the voltage on bootstrap capacitor 150 and hence limits the gate-to-source voltage ($V_{GS}$) of high side FET 185 when the input is logic low.
2. When the input is logic high, the bootstrap capacitor 150 charges slowly when the voltage at node 140 (which equals $V_{dd}-V_{GS\_135}$) approaches $V_{dd}-V_T$, which limits the $V_{GS}$ of high side FET 185 when the input is logic low.

Figure 2:
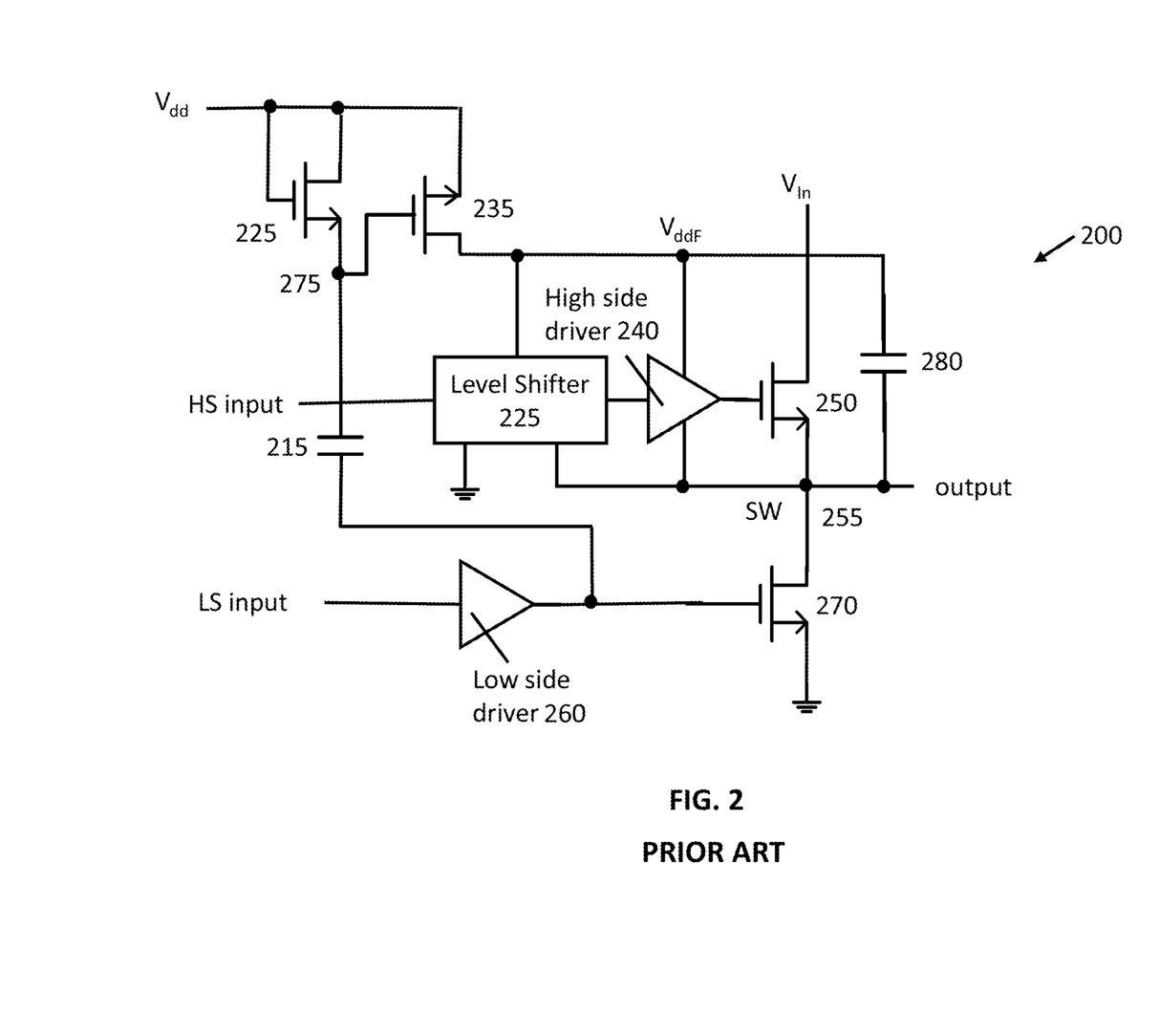
FIG. 2 is a schematic of a conventional bootstrapping supply for a half-bridge circuit.

FIG. 2 shows another bootstrapping half bridge topology. In the topology of FIG. 2, described in U.S. Pat. No. 9,667,245, the disclosure of which is incorporated by reference, the high side FET 250 is driven by high side (HS) gate driver 240 and level shifter 225 that are supplied by bootstrap capacitor 280 when low side (LS) gate driver 260 turns low side transistor 270. In this case, the voltage on the gate of low side transistor 270 is 0 volts, the voltage on the SW node/output 255 is approximately equal to $V_{in}$, and $V_{ddF}$ minus the voltage on the SW node is approximately equal to $V_{dd}$.

The bootstrap capacitor 280 is recharged when the low side transistor 270 is turned on.

Instead of recharging bootstrap capacitor 280 using just a diode (or a diode-connected transistor 135 as in FIG. 1), an active charging circuit is connected between $V_{dd}$ and $V_{ddF}$. The active charging circuit consists of a charging transistor (FET 235), a diode-connected transistor (FET 225) and a second bootstrap capacitor 215.

For a logic low on the LS input, the low side FET 270 is off, and the bootstrap capacitor 280 is supplying the HS gate driver 240 and level shifter 225. Capacitor 215 is charged to $V_{dd}$-$V_{GS\_225}$ (the gate-to-source voltage of diode-connected FET 225) and charging FET 235 is off because $V_{ddF}$ is greater than $V_{dd}$, and the gate-to-source voltage $V_{GS}$ of FET 235 is less than its threshold voltage $V_T$.

For a logic high on the LS input, the low side FET 270 is on and the high side FET 250 is off. The output 255 is at about ground. The voltage at node 275 is at about $V_{dd}$+($V_{dd}$-$V_{GS\_225}$) due to voltage stored on capacitor 215. Hence, charging FET 235 turns on, and the bootstrap capacitor 280 is recharged via FET 235 to approximately $V_{dd}$ since FET 235 has low on-resistance.

The circuit 200 described above advantageously eliminates the diode voltage drop between $V_{dd}$ and $V_{ddF}$.

SUMMARY OF THE INVENTION

The present invention overcomes the above-noted disadvantages of the FIG. 1 circuit by using the active bootstrap charging circuitry of FIG. 2 to charge the bootstrap capacitor in the circuit of FIG. 1. More specifically, the diode-connected FET 135 in the circuit of FIG. 1 is replaced with an active charging circuit comprising an active charging FET, a diode or a diode-connected FET, and a second bootstrap capacitor for charging the first bootstrap capacitor.

Compared to the conventional bootstrapping driver of FIG. 1 that charges the bootstrap capacitor with a diode or diode-connected FET, the voltage stored on the bootstrap capacitor can be charged up to the supply voltage without any diode voltage drop. As a result, when the voltage stored on the bootstrap capacitor is applied to the high side FET, a larger gate-to-source voltage on the high side FET can be obtained to achieve faster pull-up.

A substantial improvement is made using a diode-connected FET instead of a diode to charge up the bootstrap capacitors, thereby making the driver circuit more robust to process voltage and temperature variations.

One or more cascaded active charging FETs can be added to further mitigate potential issues due to high transistor threshold voltages.

The circuit of the present invention can also be applied to improve cascaded bootstrapping drivers, which have lower power consumption than conventional bootstrapping drivers.

BRIEF DESCRIPTION OF THE DRAWINGS

The above-noted features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 3:
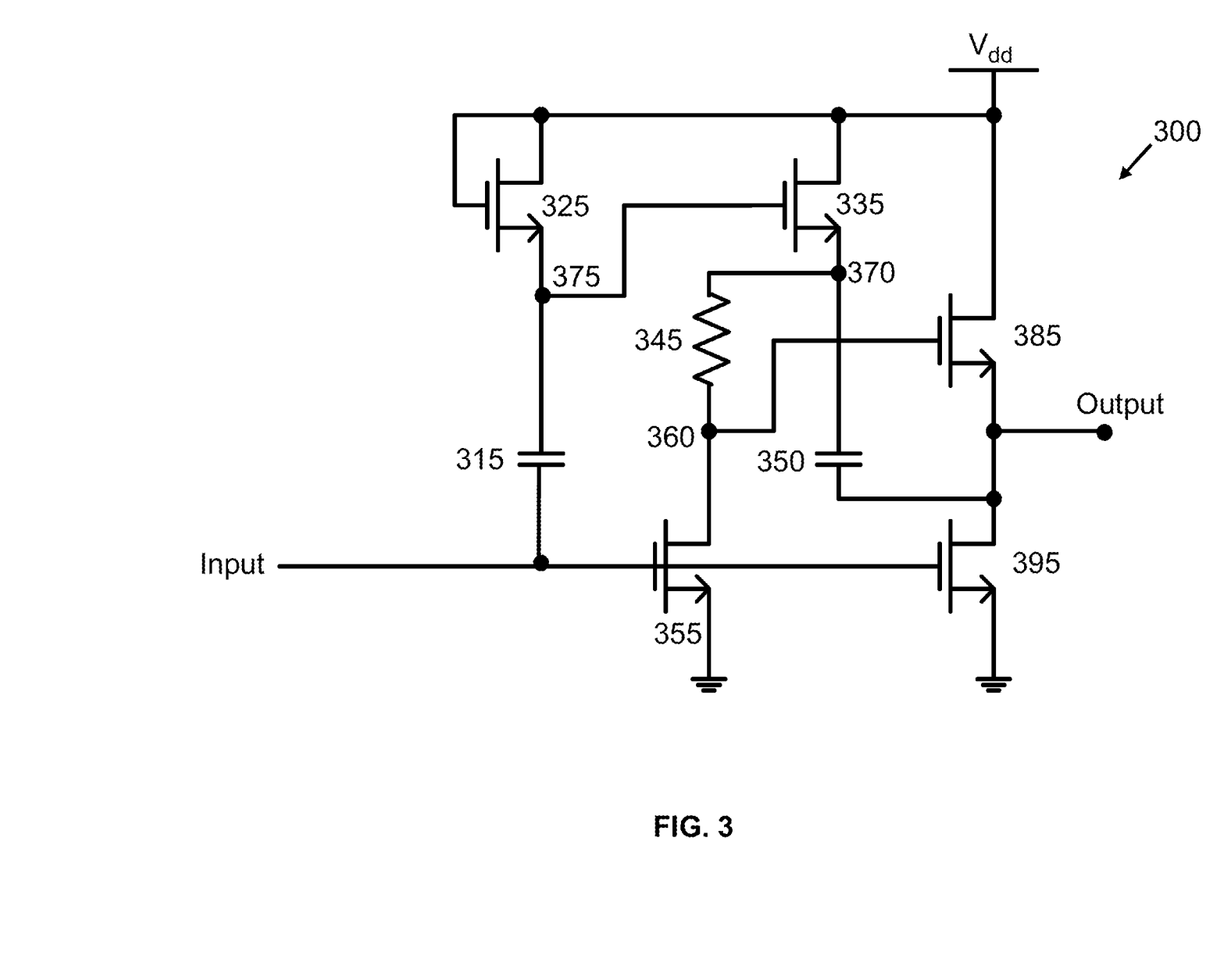
FIG. 3 is a schematic of the active bootstrapping gate driver circuit of the present invention.

Referring first to FIG. 3, a schematic of the active bootstrapping gate driver circuit 300 of the present invention is shown. Circuit 300 uses the uses the active bootstrap charging circuitry of FIG. 2 to charge the bootstrap capacitor in the circuit of FIG. 1. Specifically, in accordance with the present invention, diode connected FET 135 in FIG. 1 is replaced with an active charging circuit, namely active charging FET 335, a diode-connected FET 325 and a second bootstrap capacitor 315 for charging the first bootstrap capacitor 350.

For a logic high input (the charging mode), FET 355 and low side FET 395 are on, with node 360 and the output at ground. The voltage at node 375 is approximately equal to the voltage at the input ($V_{dd}$) plus the voltage stored on capacitor 315 during the driving mode when the input is a logic low, i.e., is approximately equal to $V_{dd}$+($V_{dd}$-$V_{GS\_325}$). Hence, FET 335 is turned on and charges capacitor 350 to approximately $V_{dd}$. Thus, the voltage stored on bootstrap capacitor 350 is maximized during the charging mode when the input is a logic high.

For a logic low input (driving mode), FET 355 and low side FET 395 are off. Since the input is at ground, capacitor 315 is recharged to $V_{dd}$-$V_{GS\_325}$. The voltage on capacitor 350 is applied to the gate-to-source voltage ($V_{GS}$) of the high side FET 385 via resistor 345, with the voltage at node 370 equal to the voltage at node 360, turning on high side FET 385. The output will increase to $V_{dd}$, with the voltage at node 370 and the voltage at node 360 going above $V_{dd}$ due to voltage stored on bootstrap capacitor 350. FET 335 turns off since the gate-to-source voltage of FET 335 is less than its threshold voltage $V_T$.

Since the gate-to-source voltage of the high side FET 385 is approximately equal to the voltage stored on the bootstrap capacitor 350 and is maximized to approximately $V_{dd}$ (instead of $V_{dd}$ minus the gate-to-source voltage of the FET 135 in the circuit shown in FIG. 1) when the input is logic low (the driving mode), faster pulling "out" to $V_{dd}$ is achieved.

The high side FET 385 and the low side FET 395, and the other three FETs in the active bootstrapping gate driver circuit 300 of FIG. 3 (and all FETs in the circuits of the other embodiments described below) are preferably enhancement mode GaN FET semiconductor devices, which are monolithically integrated onto a single semiconductor die. Because GaN FETs are able to carry large currents, support high voltages, and switch more quickly than conventional transistors, they enable the active bootstrapping gate driver circuits of the present invention 300 to provide quicker turn-on and turn-off times than similar circuits implementing other transistors, such as MOSFETs.

A potential issue with the bootstrap circuit of FIG. 3 is that, for FETs with a high threshold voltage ($V_T$), the voltage stored on capacitor 315 (which equals $V_{dd}$-$V_{GS\_325}$) during the driving mode (when the input is a logic low) may be limited. Therefore, FET 335 may not be fully turned on during the charging mode (when the input is logic high) and charging of bootstrap capacitor 350 will become slow.

Figure 4A:
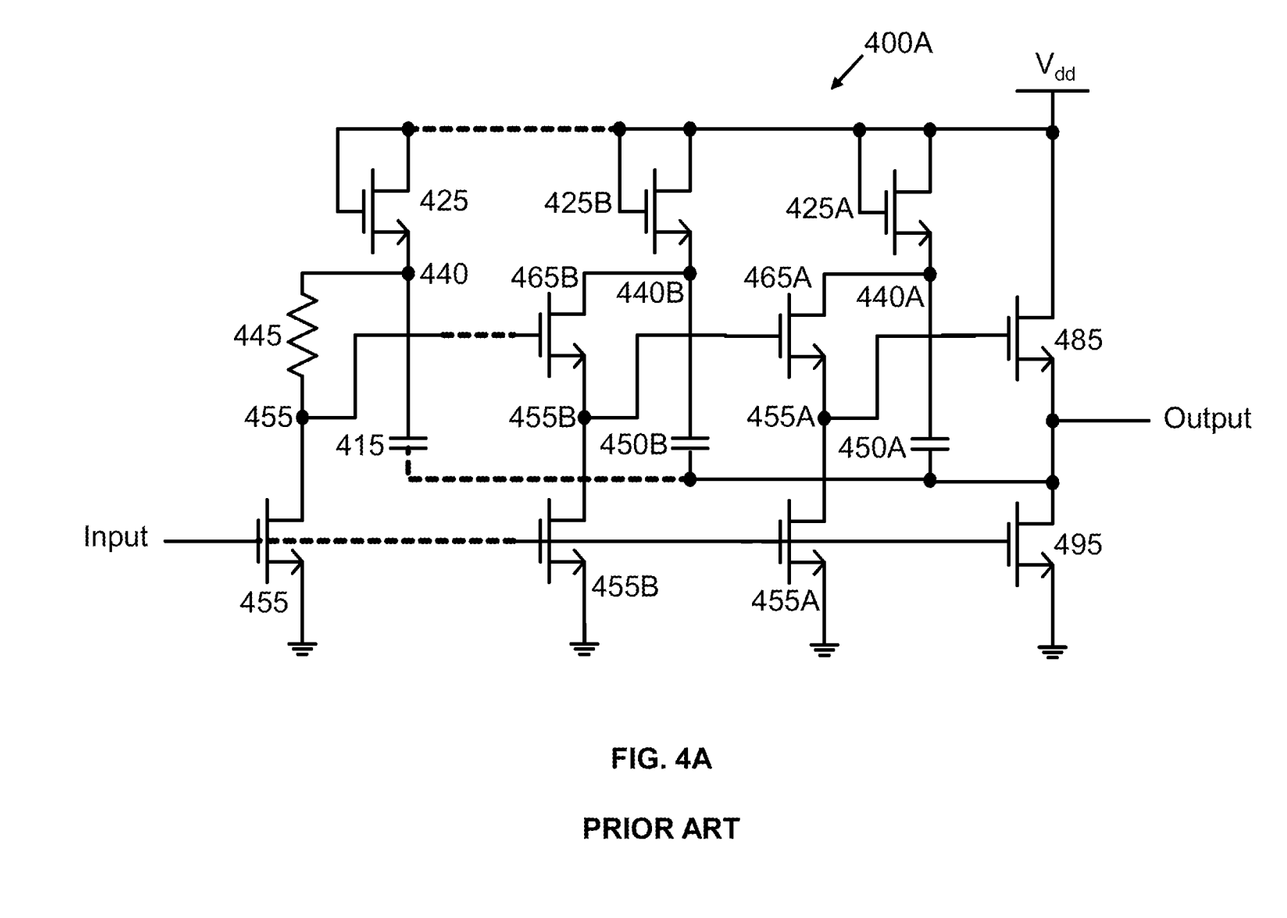
FIG. 4A is a schematic of a conventional cascaded bootstrapping gate driver circuit.
Figure 4B:
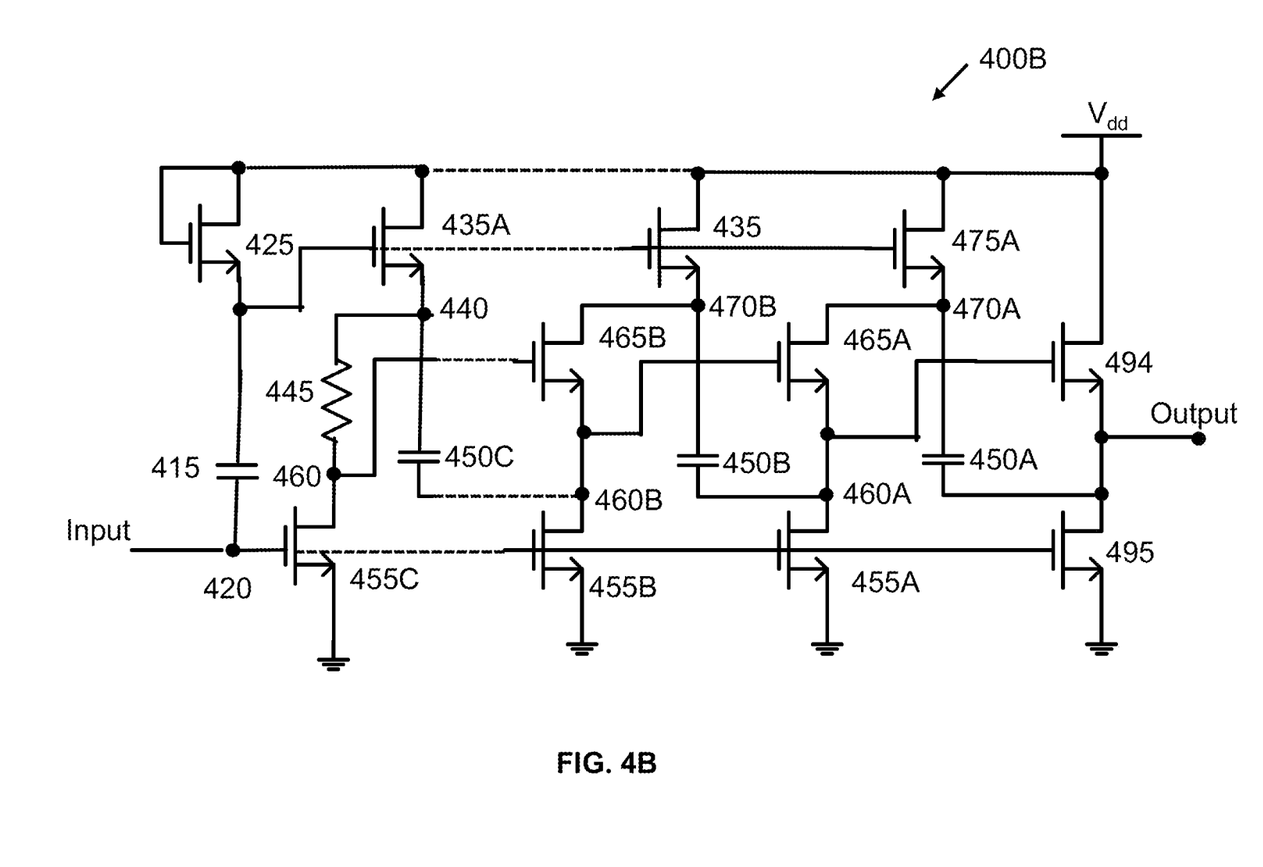
FIG. 4B is a schematic of a cascaded active bootstrapping gate driver circuit with an active charging circuit in accordance with the present invention.

The active charging circuit of the present invention shown in FIG. 3 can be extended to cascaded bootstrapping drivers, as illustrated in FIGS. 4A and 4B, where like reference numbers in the 400's of FIG. 4 represent corresponding elements in the 300's of FIG. 3, with A and B suffixes added to represent the additional (cascaded) stage.

FIG. 4A shows a conventional bootstrapping driver, as disclosed in U.S. Pat. No. 10,790,811, the disclosure of which is incorporated by reference. In the cascaded embodiment of the present invention shown in FIG. 4B, the diode-connected FETs (425, 425A and 432B) are replaced with active charging FETs (435). Only one diode-connected FET 425 and one secondary bootstrap capacitor 415 are needed to control the gates of the active charging FETs 435.

Figure 5:
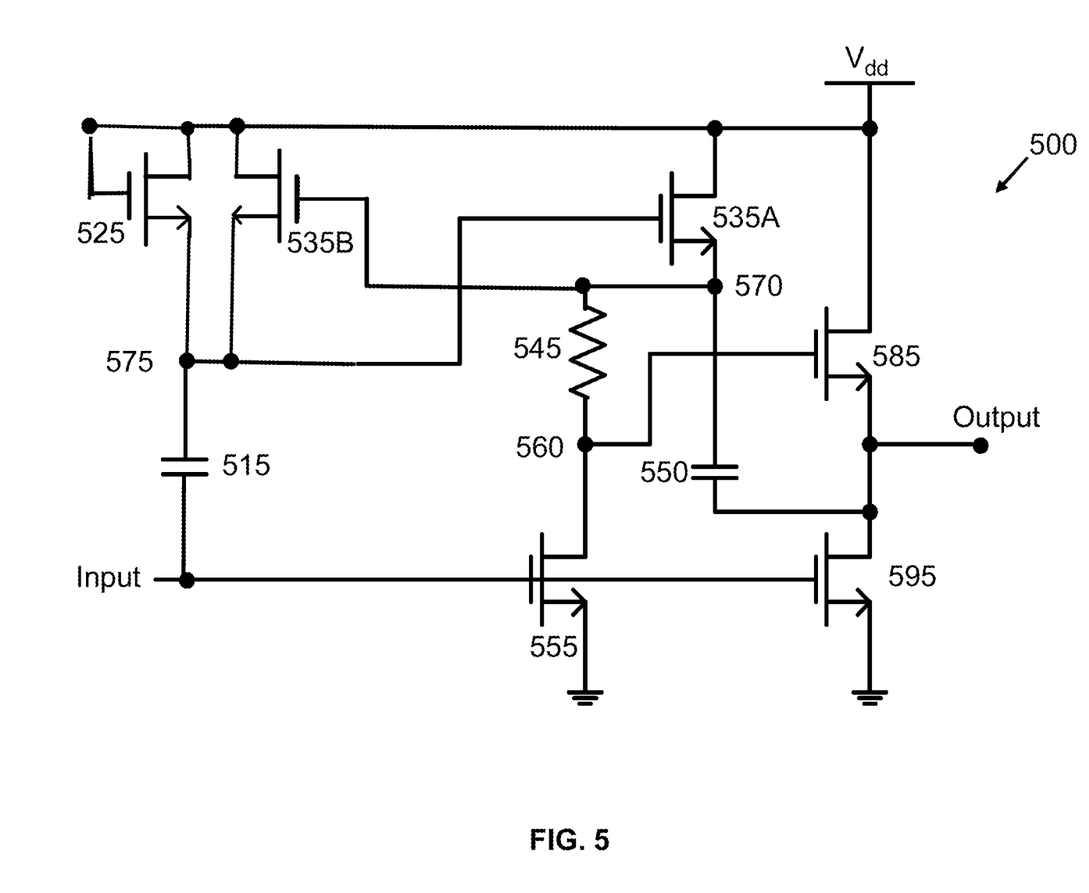
FIG. 5 is a schematic of a second embodiment of the active bootstrapping gate driver circuit of the present invention, with a second active charging FET.

Referring to FIG. 5, in a further embodiment of the active bootstrapping gate driver of the present invention, a second active charging FET (535B) is added to the diode-connected FET (525) and the second bootstrap capacitor (515) to mitigate the potential issue of limited voltage stored on the bootstrap capacitor in the active bootstrapping driver of FIG. 3. Again, like reference numbers in the 500's of FIG. 5 represent corresponding elements in the 300's of FIG. 3, and A and B suffixes are added to represent the original active charging FET 535A corresponding to FET 335 of FIG. 3, and 535B identifies the additional (second) active charging FET. The gate of FET 535B can be either connected to node 570 (as shown in FIG. 5) or to node 560 (not shown in FIG. 5B).

The purpose of FET 535B is to charge capacitor 515 to approximately $V_{dd}$, instead of to $V_{dd}$-$V_{GS\_535A}$ when the input is a logic low (driving mode). During this mode, the output is approximately at $V_{dd}$, and the voltage at node 560 and node 570 will be above $V_{dd}$ by another $V_{dd}$ to keep FET 535B turned on with low on-resistance.

When the input is a logic high (charging mode), FET 535B is off since the voltage at node 575 is at a voltage higher than $V_{dd}$ and is higher than voltage at node 560 (which is at ground) or the voltage at node 570 (which is at approximately $V_{dd}$ due to FET 535A turning on).

Diode-connected FET 525 may still be needed. During startup with the input at logic low, FET 525 will charge up capacitor 515 without relying on FET 535B, which may not turn on if bootstrap capacitor 550 is not yet charged.

Figure 6:
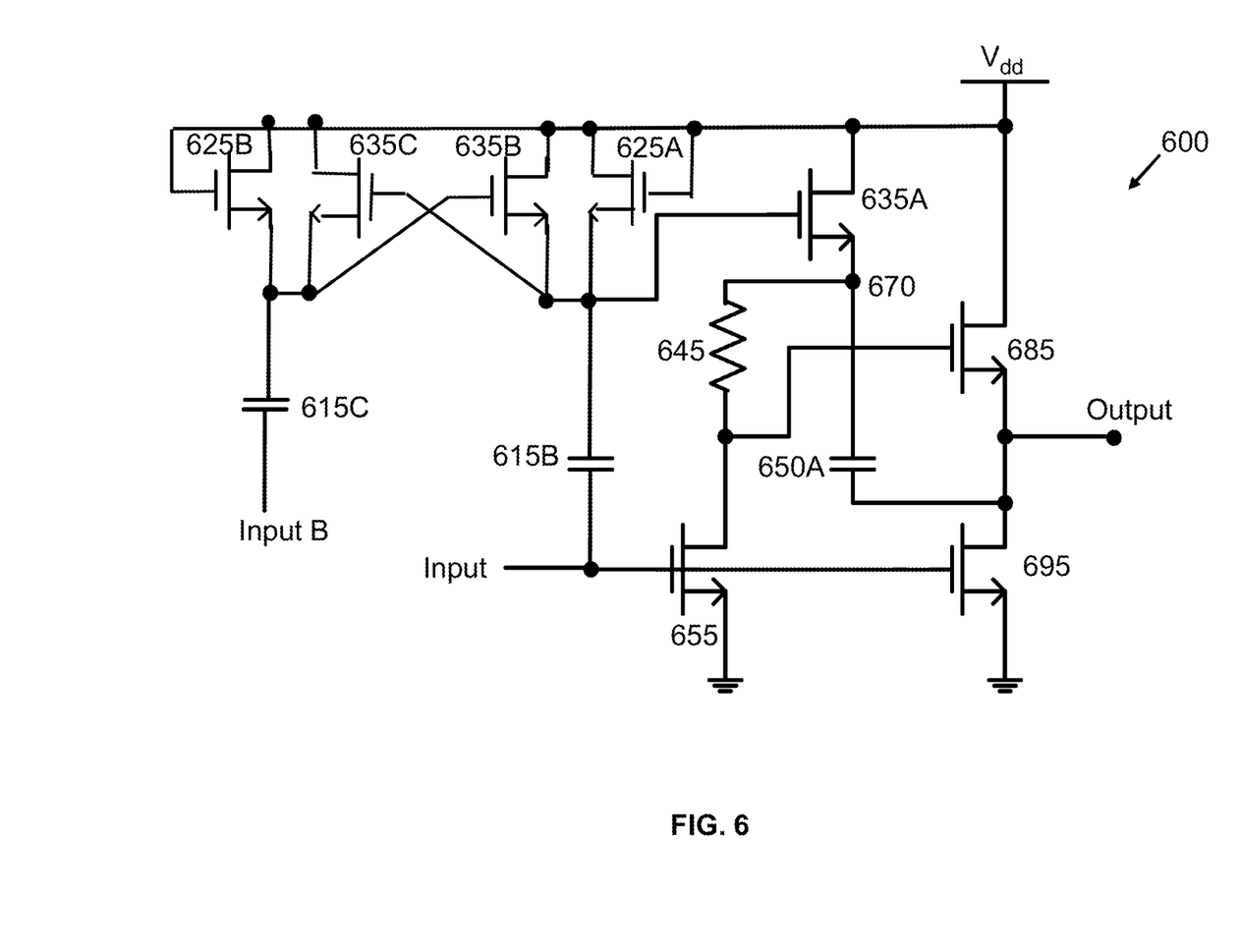
FIG. 6 is a schematic of a third embodiment of the active bootstrapping gate driver circuit of the present invention, with a third active charging FET and a third bootstrap capacitor.

For the cascaded active bootstrapping driver shown in FIG. 4B, only one extra active charging FET for the second bootstrap capacitor 415 is required. Again, the gate of this active charging FET can either connect to the source of the active charging FET 475A or the gate of the high side (pull-up FET), Turning now to FIG. 6, if the complimentary input (logically inversed input)—input B—is also available, the second active charging FET 635B can be controlled by another active charging circuit consisting of a third bootstrap capacitor 615C, a third charging FET 635C and a second diode-connected FET 625B. The third charging FET 635C can be in turn controlled by the second bootstrap capacitor 615B to charge up capacitor 615C.

Figure 7:
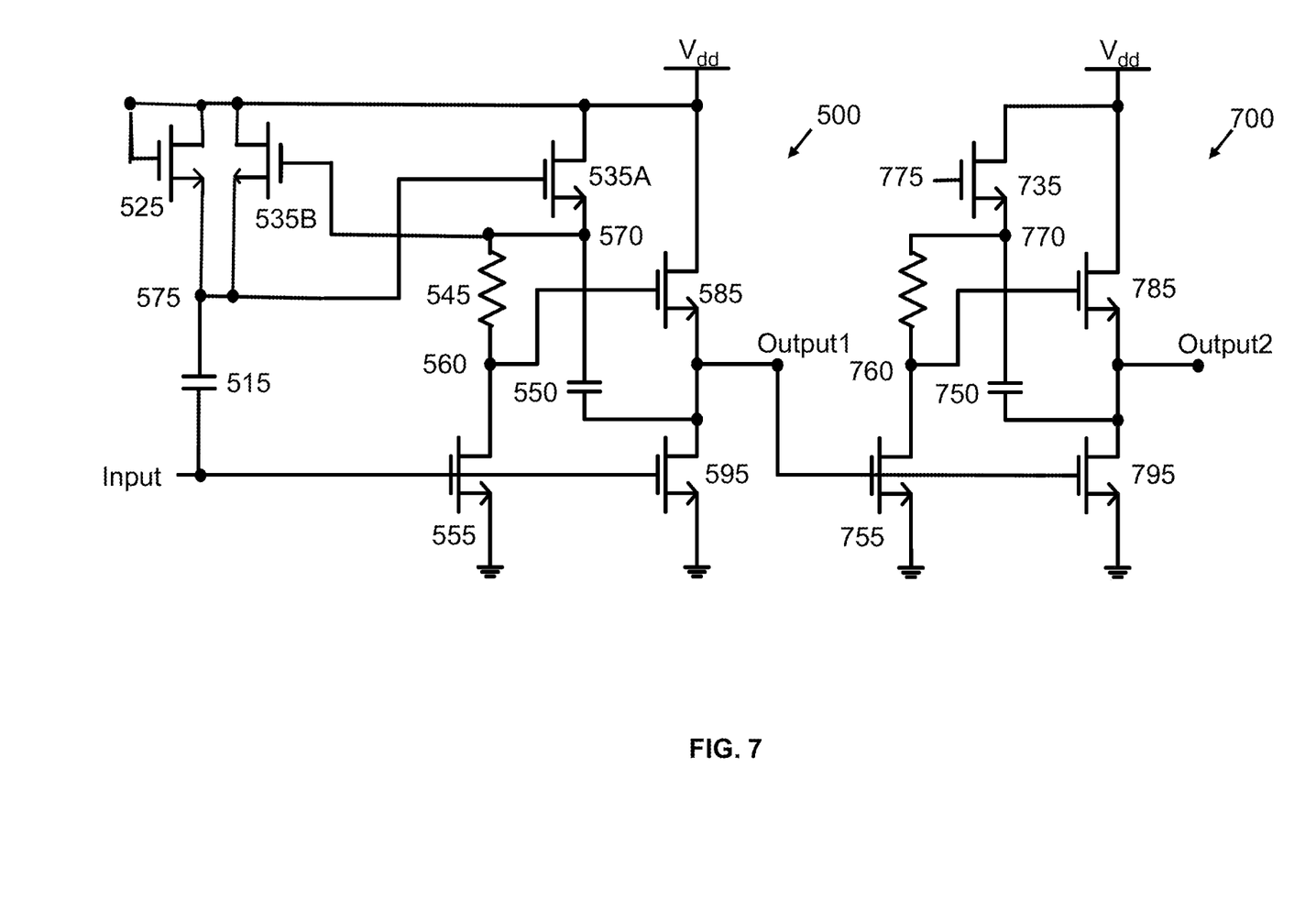
FIG. 7 is a schematic of cascading two active bootstrapping gate driver circuits, with the active charging FET in the second gate driver circuit controlled by the first bootstrap capacitor of the first active bootstrapping gate driver circuit.

When two or more active bootstrapping drivers are coupled in cascade, the active charging FET for charging the first bootstrap capacitor in each driver can be controlled by the first bootstrap capacitor in the preceding driver, as illustrated in FIG. 7. The active bootstrapping driver 500 is the preceding driver of the active bootstrapping driver 700. The output of driver 500, output1, is coupled to the input of driver 700. The gate, 775, of the active charging FET 735 in driver 700 is not controlled by the second bootstrap capacitor, the diode-connected FET and/or the second active charging FET inside driver 700. Instead, the gate 775 of the active charging FET 735 in driver 700 is coupled to the first bootstrap capacitor 550 of the preceding driver 500 on node 570.

When output1 is logic high (equal to $V_{dd}$), FET 755 and FET 795 are on, while the high side FET 785 is off. Due to the voltage stored on the first bootstrap capacitor 550 in driver 500, the gate 775 of the active charging FET 735 (coupled to node 570) will be driven to be equal to $V_{dd}$ plus voltage stored on capacitor 550. As a result, FET 735 is turned on with low resistance between the drain and the source terminals such that the first bootstrap capacitor 750 in driver 700 will be charged to $V_{dd}$.

When output1 is logic low, FET 755 and FET 795 are off, while the high side FET 785 is on. The output2 will be pulled to $V_{dd}$ with the voltage on node 770 being pulled to $V_{dd}$ plus voltage stored on capacitor 750. The active charging FET 535A in driver 500 will be turned on, setting the voltage on node 570 (and hence the gate 775 of FET 735 in driver 700) to $V_{dd}$. As a result, the active charging FET 735 in driver 700 will be off, allowing the voltage on node 770 (and hence, the gate voltage of FET 785) to be higher than $V_{dd}$ for pulling output2 to $V_{dd}$.

When an additional active bootstrapping driver is coupled to the output, output2, of the driver 700, the voltage on node 770 can be used for controlling the active charging FET inside this additional driver. As a result, the second bootstrap capacitor connected to the input, the diode-connected FET and the second active charging FET within each cascaded driver are not required, except for the first active bootstrapping driver, when a number of active bootstrapping drivers are cascaded. This advantageously reduces the required die area for implementing drivers for driving large output loads.

In summary, compared to the conventional bootstrapping driver that charges the bootstrap capacitor with a diode or diode-connected FET, the voltage stored on the bootstrap capacitor of the active bootstrapping gate driver circuit of the present invention can be charged up to the supply voltage without any diode voltage drop. As a result, when the voltage stored on the bootstrap capacitor is applied to the high side (pull-up) FET of the half bridge circuit, a relatively larger gate-to-source on the high side FET is obtained to achieve a driver with faster pull-up.

The active bootstrapping circuit of the present invention can be used effectively with diodes or diode-connected FETs (as shown). However, the use of diode-connected FETs with a relatively high threshold voltage in the preferred embodiments disclosed herein is more robust to process, and more robust with respect to voltage and temperature variations.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A bootstrapping gate driver for a high side FET having a drain terminal connected to a supply voltage, a source terminal connected to an output, and a gate terminal, the bootstrapping gate driver comprising:
   an input for receiving a control signal; and
   a bootstrap capacitor electrically connected between the supply voltage and ground when the control signal corresponds to a charging phase, thereby charging the capacitor, the capacitor being electrically connected to the gate terminal of the high side FET when the control signal corresponds to a driving stage;
   an active charging circuit comprising: (i) a first charging FET, a diode or a diode-connected FET, and a second bootstrap capacitor for charging the first bootstrap capacitor up to the supply voltage without a diode voltage drop when the control signal corresponds to the driving stage; and (ii) a second charging FET to mitigate slow charging of the first bootstrap capacitor.

2. The bootstrapping gate driver of claim 1, further comprising a resistor electrically connected between the supply voltage and the gate of the high side FET to decrease static current consumption.

3. The bootstrapping gate driver of claim 1, further comprising a low side FET for turning off the high side FET, the low side FET having a drain terminal connected to the source of the high side FET and the output, a gate terminal connected to the input, and a source terminal connected to ground.

4. The bootstrapping gate driver of claim 1, further comprising a second input and a second active charging circuit including a third active charging FET, a second diode or diode-connected FET, and a third bootstrap capacitor, the third bootstrap capacitor being connected to and controlled by a third active charging FET and a second diode or diode-connected FET, the third active charging FET being controlled in turn by the voltage on the second bootstrap capacitor.

5. The bootstrapping gate driver of claim 4, wherein the additional stage of the active charging circuitry comprises a FET that is smaller than the high side FET, and the secondary stage comprises a FET that is smaller than the FET of active charging circuit, and wherein the bootstrap capacitor is smaller than the bootstrap capacitor of the additional stage of the active charging circuitry.

6. The bootstrapping gate driver of claim 1, wherein the active charging circuit is cascaded such that the bootstrapping gate driver comprises at least one additional stage of the active charging circuitry.

7. The bootstrapping gate driver of claim 1, wherein the active charging circuit is cascaded, such that the bootstrapping gate driver comprises at least one additional stage of the active charging circuitry, and the charging FET for charging the first bootstrap capacitor in each driver stage is controlled by the first bootstrap capacitor in the preceding driver stage.

8. The bootstrapping gate driver of claim 1, wherein the FETs of the bootstrapping gate driver are gallium nitride (GaN) FETs.

* * * * *